(12) United States Patent
Jo et al.

(10) Patent No.: US 9,983,451 B2
(45) Date of Patent: May 29, 2018

(54) REWORK METHOD OF ARRAY SUBSTRATE FOR DISPLAY DEVICE AND ARRAY SUBSTRATE FORMED BY THE METHOD

(71) Applicant: LG Display Co., Ltd., Seoul (KR)

(72) Inventors: ChelHee Jo, Daejeon (KR); KiTaeg Shin, Daegu (KR); Donggeun Lim, Namwon-si (KR); Jiwon Kang, Gyeryong-si (KR)

(73) Assignee: LG Display Co., Ltd., Seoul (KR)

( * ) Notice: Subject to any disclaimer, the term of this patent is extended or adjusted under 35 U.S.C. 154(b) by 1 day.

(21) Appl. No.: 15/194,079

(22) Filed: Jun. 27, 2016

(65) Prior Publication Data

US 2016/0327844 A1    Nov. 10, 2016

Related U.S. Application Data

(63) Continuation of application No. 14/341,599, filed on Jul. 25, 2014, now Pat. No. 9,385,146.

(30) Foreign Application Priority Data

Apr. 29, 2014  (KR) .................. 10-2014-0051477

(51) Int. Cl.
  *G02F 1/1362* (2006.01)
  *H01L 27/12* (2006.01)
  (Continued)

(52) U.S. Cl.
  CPC ...... *G02F 1/136259* (2013.01); *G02F 1/1368* (2013.01); *G02F 1/13306* (2013.01); *G02F 1/13439* (2013.01); *G02F 1/133345* (2013.01); *G02F 1/134309* (2013.01); *G02F 1/136227* (2013.01); *G02F 1/136286* (2013.01);
  (Continued)

(58) Field of Classification Search
  CPC ................................... G02F 1/136259
  See application file for complete search history.

(56) References Cited

U.S. PATENT DOCUMENTS

2004/0041520 A1  3/2004 Wu et al.
2012/0068944 A1  3/2012 Oh et al.

FOREIGN PATENT DOCUMENTS

CN    1991544 A    7/2007
CN    102411239 A    4/2012

OTHER PUBLICATIONS

Office Action for U.S. Appl. No. 14/341,599, dated Nov. 10, 2015, 10 Pages.
(Continued)

*Primary Examiner* — Edmond Lau
(74) *Attorney, Agent, or Firm* — Fenwick & West LLP

(57) ABSTRACT

The present invention provides a method of reworking an array substrate including a gate metal layer, a gate insulation layer (G1), a semiconductor layer, a source/drain metal layer, a lower passivation layer, a common electrode layer, an upper passivation layer, and a pixel electrode layer sequentially formed therein. By using a rework mask protecting a jumping passivation hole area in reworking the pixel electrode layer, the method can maintain the electric connection between the common electrode layer and the rework pixel electrode pattern in the jumping passivation hole area even after the pixel electrode rework process, to thereby reduce the occurrence of failure and the reduction of throughput due to the rework process.

17 Claims, 10 Drawing Sheets

(51) Int. Cl.
*G02F 1/1368* (2006.01)
*G02F 1/133* (2006.01)
*G02F 1/1333* (2006.01)
*G02F 1/1343* (2006.01)

(52) U.S. Cl.
CPC ........ *H01L 27/124* (2013.01); *H01L 27/1248* (2013.01); *H01L 27/1288* (2013.01); *G02F 2001/134372* (2013.01); *G02F 2001/136295* (2013.01); *G02F 2201/123* (2013.01)

(56) References Cited

OTHER PUBLICATIONS

Chinese Office Action, Chinese Application 201410437838.7, dated Jun. 13, 2017, 7 pages.

REWORK METHOD OF ARRAY SUBSTRATE FOR DISPLAY DEVICE AND ARRAY SUBSTRATE FORMED BY THE METHOD

CROSS-REFERENCE TO RELATED APPLICATION

This application is a continuation application of U.S. patent application Ser. No. 14/341,599, filed on Jul. 25, 2014, which claims priority from and the benefit under 35 U.S.C. § 119(a) of Korean Patent Application No. 10-2014-0051477, filed on Apr. 29, 2014, all of which are hereby incorporated by reference as if fully set forth herein.

BACKGROUND

1. Field of Art

The present invention relates to a rework method of an array substrate for a display device and an array substrate formed by the rework method. Particularly, the present invention relates to a rework method of an array substrate, which can prevent damage to a common electrode layer (Vcom ITO) in a jumping passivation hole (PAS hole) area for interconnecting the common electrode layer and a common electrode (Vcom) metal line of a non-active area at the time of the rework process due to a defect of the array substrate.

2. Description of the Related Art

With the development of an information society, various types of requirements for a display device of displaying an image are increasing. Recently, various display devices, such as a Liquid Crystal Display (LCD), a Plasma Display Panel (PDP), and an Organic Light Emitting Diode Display Device (OLED), are being used.

Among those display devices, a Liquid Crystal Display (LCD) device includes an array substrate including a thin film transistor, which is a switching device for controlling on/off of each pixel area, an upper substrate including color filters and/or black matrixes, a display panel including a liquid crystal layer formed between the array substrate and the upper substrate, and a driving unit for controlling the thin film transistor. In an LCD device, alignment of the liquid crystal layer is controlled according to an electric field applied between a common voltage (Vcom) electrode and a pixel (PXL) electrode provided at a pixel area, so as to adjust the transmissivity of light and thereby form an image.

In the array substrate, an Active Area (AA) including one or more pixels and a Non-active Area (NA) are defined. Further, a plurality of Gate Lines (GL) and a plurality of Data Lines (DL) cross each other to define Pixels (P) on an inner surface of the active area AA of the array substrate, which is usually called a lower substrate, and each intersection between the gate lines and the data lines is provided with a Thin film transistor T, which has a one-to-one correspondence with and is connected to a transparent pixel electrode (not shown) in each pixel P.

On the array substrate, a plurality of layers, such as a gate metal layer, a semiconductor layer, a source/drain metal layer, a pixel electrode layer, and a common electrode layer, are formed to create such thin film transistors and wire lines as described above, and an inter-layer insulation layer or a protection layer may be formed between every layer.

Meanwhile, there is a Twisted Nematic (TN) scheme, in which liquid crystal is injected between an array substrate having a pixel electrode formed thereon and an upper substrate having a common voltage electrode formed thereon, separated from each other, and liquid crystal molecules in a nematic phase are driven in a direction perpendicular to the substrates. However, a liquid crystal display device of the twisted nematic scheme as described above is disadvantageous in that it has a narrow viewing angle of about 90 degrees.

In this regard, there is an In-Plane Switching (IPS) type liquid crystal display device which drives liquid crystal molecules in a direction parallel to the substrate to thereby increase the viewing angle to 170 degrees or larger. The IPS type liquid crystal display device basically includes a pixel electrode and a common voltage electrode simultaneously formed on a lower substrate or an array substrate. However, there are two types of IPS type crystal display devices including one type in which both the pixel electrode and the common voltage electrode are formed on the same layer and a Fringe Field Switching (FFS) type in which both the electrodes are formed to be horizontally spaced apart from each other with one or more insulation layers between them and one of the electrodes has a shape of a finger.

Further, a connection pad for connection to a driving unit disposed at an inner or outer portion of the substrate, a signal application pad for applying a reference voltage or reference signals, and various pads for measurement may be formed on a part of the Non-Active area (NA) outside of the Active Area (AA) in the array substrate.

Meanwhile, a common voltage metal line for applying a common voltage (Vcom) is formed on the non-active area of the array substrate, and this common voltage metal line should be connected to a common electrode disposed in the active area.

As described above, a jumping passivation hole (PAS hole) for electrically interconnecting the common electrode layer and the common voltage metal line of the non-display area is formed, and a common electrode and a pixel electrode are in contact with and stacked on each other in the jumping passivation hole area.

Meanwhile, when a defect occurs in a pixel electrode layer, which is the highest electrode layer of an array substrate, a rework process is performed to remove and then re-establish the pixel electrode layer, i.e. the highest electrode layer. In the rework process, the common electrode and the pixel electrode in the jumping passivation hole as described above may be simultaneously removed to cause contact failure between the re-established (reworked) pixel electrode layer and common electrode layer.

SUMMARY

An aspect of the present invention is to provide an array substrate rework method and an array substrate formed by the rework method, which can prevent occurrence of a defect in a jumping pixel electrode pattern in a rework process thereof in an array substrate for a display device in which the jumping pixel electrode pattern is the highest layer.

Another aspect of the present invention is to provide an array substrate rework method and an array substrate formed by the rework method, which can prevent removal of a jumping pixel electrode pattern and a common electrode layer during a rework process in a jumping passivation hole area for electrically interconnecting a common electrode layer and a common voltage metal line formed at a non-active area of a display panel, so as to minimize failure due to the jumping pixel electrode pattern rework process.

Another aspect of the present invention is to provide an array substrate rework method and an array substrate formed by the rework method, which use a rework mask having a light blocking pattern corresponding to a jumping passivation hole area in a process of reworking a jumping pixel electrode pattern, the highest layer of an array substrate, so that the electric contact between the jumping pixel electrode pattern and a common electrode layer in the jumping passivation hole area can be maintained after the rework process.

According to an embodiment of the present invention, it is possible to prevent occurrence of a defect in a jumping pixel electrode pattern in a rework process thereof in an array substrate for a display device in which the jumping pixel electrode pattern is formed as a the highest layer.

More specifically, it is possible to prevent removal of a jumping pixel electrode pattern and a common electrode layer of a jumping passivation hole area for electrically interconnecting a common electrode layer and a common voltage metal line formed at a non-active area of a display panel during a rework process of a highest jumping pixel electrode pattern of an array substrate, so as to minimize failure due to the rework process.

Further, an embodiment of the present invention employs a rework mask having a light blocking pattern corresponding to a jumping passivation hole area in a process of reworking a jumping pixel electrode pattern, the highest layer of an array substrate, so that the electric contact between a jumping pixel electrode pattern and a common electrode layer in the jumping passivation hole area can be maintained after the rework process.

BRIEF DESCRIPTION OF THE DRAWINGS

The above and other objects, features and advantages of the present invention will be more apparent from the following detailed description taken in conjunction with the accompanying drawings, in which:

FIGS. 1A and 1B illustrate an array substrate of a display panel according to an embodiment of the present invention, wherein FIG. 1A is a plan view of the array substrate and FIG. 1B is a sectional view of the array substrate;

DETAILED DESCRIPTION

Figure 1A:
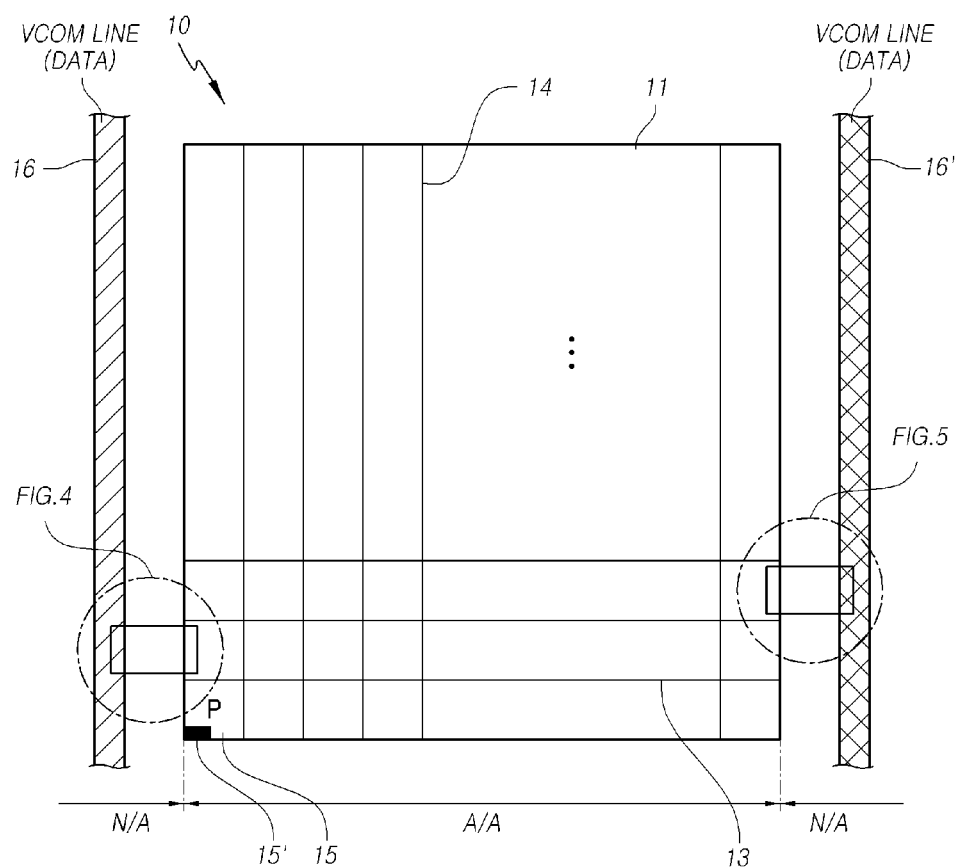

Hereinafter, exemplary embodiments of the present invention will be described with reference to the accompanying drawings. In designating elements of the drawings by reference numerals, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. These terms are merely used to distinguish one element from another element, and do not limit a true nature, a sequence, an order, the number, etc. of the corresponding element. It should be noted that if it is described in the specification that one component is "connected," "coupled" or "joined" to another component, a third component maybe "connected," "coupled," and "joined" between the first and second components, although the first component may be directly connected, coupled or joined to the second component.

Figure 1B:
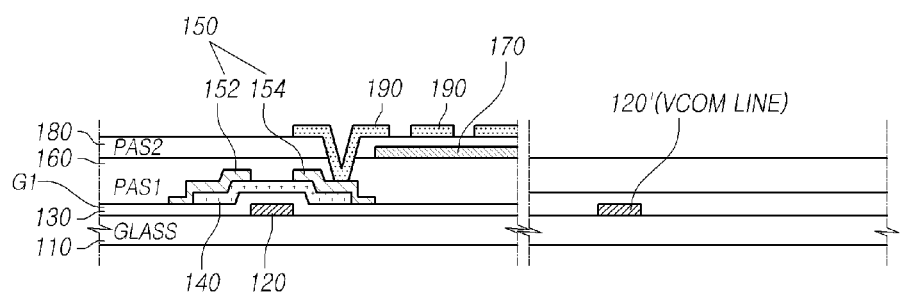

FIGS. 1A and 1B illustrate an array substrate of a display panel according to an embodiment of the present invention, wherein FIG. 1A is a plan view of the array substrate and FIG. 1B is a sectional view of the array substrate.

An array substrate of a liquid crystal display device, to which an embodiment of the present invention can be applied, includes an Active Area (AA) 11 including pixels 15 formed at areas at which a plurality of gate lines 13 and a plurality of data lines 14 cross each other, respectively, and a non-active area (NA) 12 disposed outside of the active area.

Each pixel 15 includes at least one thin film transistor 15' formed therein and a pixel electrode that is made of a transparent conductive material and connected to a drain electrode included in the thin film transistor.

Meanwhile, as briefly described above, modes of the liquid crystal display device include a Twisted Nematic (TN) mode, a Vertical Alignment (VA) mode, an In-Plane Switching (IPS) mode, and a Fringe Field Switching (FFS) mode according to the schemes of adjusting the alignment of the liquid crystal layer. Among the modes, the IPS mode and the FFS mode are modes in which a pixel electrode and a common electrode are disposed on a lower substrate to adjust the alignment of the liquid crystal layer by an electric field between the pixel electrode and the common electrode.

In the IPS mode, pixel electrodes and common electrodes are alternately arranged in parallel to adjust the alignment of the liquid crystal layer by generating an in-plane electric field between the electrodes of both sides. In the IPS mode, it is impossible to adjust the alignment of the liquid crystal layer at upper portions of the common electrode and the pixel electrode, which degrades the transmissivity of light at the upper portions.

The FFS mode is a mode invented to solve the shortcomings of the IPS mode. In the FFS mode, a pixel electrode and a common electrode are spaced apart with an insulation layer between them, wherein one of the two electrodes is formed in a shape of a plate or a pattern while the other electrode is formed in a shape of a finger to adjust the alignment of the liquid crystal layer through a fringe field generated between the two electrodes.

A display device to which an embodiment of the present invention is applied may be a liquid crystal display device of the FFS mode, without limiting the present invention thereto.

Further, a display device to which an embodiment of the present invention is applied includes a back light unit and a driving circuit unit for supplying light to the liquid crystal panel, as well as the array substrate, wherein the driving circuit unit includes a timing controller (T-con), a data driver (D-IC), a gate driver (G-IC), a backlight driving unit, and a power supply unit supplying electric power to driving circuits. Further, all or a part of the driving circuit unit may be formed on the liquid crystal panel according to a Chip On Glass (COG) or a Chip On Flexible printed circuit or Chip On Film (COG) mode, and a more detailed description of the back light unit and the driving circuit unit is omitted here.

Meanwhile, in a non-active area of an array substrate of a display device to which an embodiment of the present invention is applied, a common voltage metal line for applying a common voltage is formed, wherein the common voltage metal line may be formed of one of a gate metal layer and a source/drain metal layer.

Although a common voltage metal line 16 at a gate metal layer is formed at the left side of the panel and a common voltage metal line 16' at a source/drain metal layer or data metal layer is formed at the right side of the panel in the array substrate of FIG. 1A, the present invention is not limited thereto.

Meanwhile, the common voltage metal line of the non-active area as described above should be electrically connected to a common voltage electrode or common electrode (Vcom ITO) formed on the active area. To this end, at least one jumping passivation hole (PAS hole) may be formed.

As described above, a jumping passivation hole in the present disclosure may be defined to include all openings or contact holes formed in order to electrically interconnect a common electrode and a common voltage metal line. In a narrower sense, the jumping passivation hole refers to a hole or opening, which opens a part of a passivation layer on a common electrode or a common voltage metal line.

The sectional view of FIG. 1B shows an example of a so-called Pixel-On-Top (POT) in which a pixel electrode is disposed at an uppermost position of an array substrate or a lower substrate, which corresponds to one of the FFS mode liquid crystal display device according to an embodiment of the present invention.

However, the present invention is not limited to a POT type FFS mode liquid crystal display device, which will be described below in more detail.

Further, in an array substrate to which an embodiment of the present invention can be applied, a passivation layer may include a lower passivation layer PAS1 for electrically insulating a common voltage electrode pattern and a source/drain metal layer from each other and an upper passivation layer PAS2 for electrically insulating a highest layer pixel electrode pattern and a common voltage electrode pattern from each other.

As shown and described below, the passivation layers include a first inorganic passivation layer PAS1 as the lower passivation layer and a second inorganic passivation layer PAS2 as the upper passivation layer. However, the lower passivation layer may have a multi-layer structure including a first inorganic passivation layer PAS1 and an organic passivation layer PAC formed on the first inorganic passivation layer.

The inorganic passivation layer maybe formed of an inorganic insulation material, such as silicon nitride SiNx or silicon oxide $SiO_2$ and the organic passivation layer may be formed of a material, such as photo-arcryl, acrylate, or polyamide, without limiting the present invention thereto.

Now, the sectional view of the array substrate to which an embodiment of the present invention can be applied will be discussed in more detail. First, a gate metal layer is formed on a substrate 110, such as an organic substrate and is then subject to a patterning process including a photolithography process using a gate mask to form a gate metal layer or gate metal pattern including a gate electrode 120.

In the process of forming such a gate metal layer, the gate electrode 120 may be formed on an active area and a common voltage metal line 120' for applying common voltage Vcom may be formed on a non-active area. Of course, the common voltage metal line may be formed at the same layer as the data metal layer or source/drain metal layer other than the gate metal layer.

A gate insulation layer or Gate Insulator (GI) 130 is formed on the gate metal layer, a semiconductor layer 140 forming a channel of the thin film transistor is formed thereon, and a source/drain metal pattern or source/drain metal layer 150 including a source electrode 152 and a drain electrode 154 is formed thereon.

In this state, a first inorganic passivation layer PAS1 160, which is a lower passivation layer, is laminated thereon, and a common voltage electrode layer or common electrode layer is deposited thereon and is then patterned to form a common electrode layer 170.

Then, a second inorganic passivation layer PAS2 180 is formed as an upper passivation layer on the common electrode layer 170, a pattern including a drain contact hole is formed on the drain electrode 154 by using a second passivation layer mask, and a highest layer pixel electrode layer 190 is formed thereon.

Figure 2A:
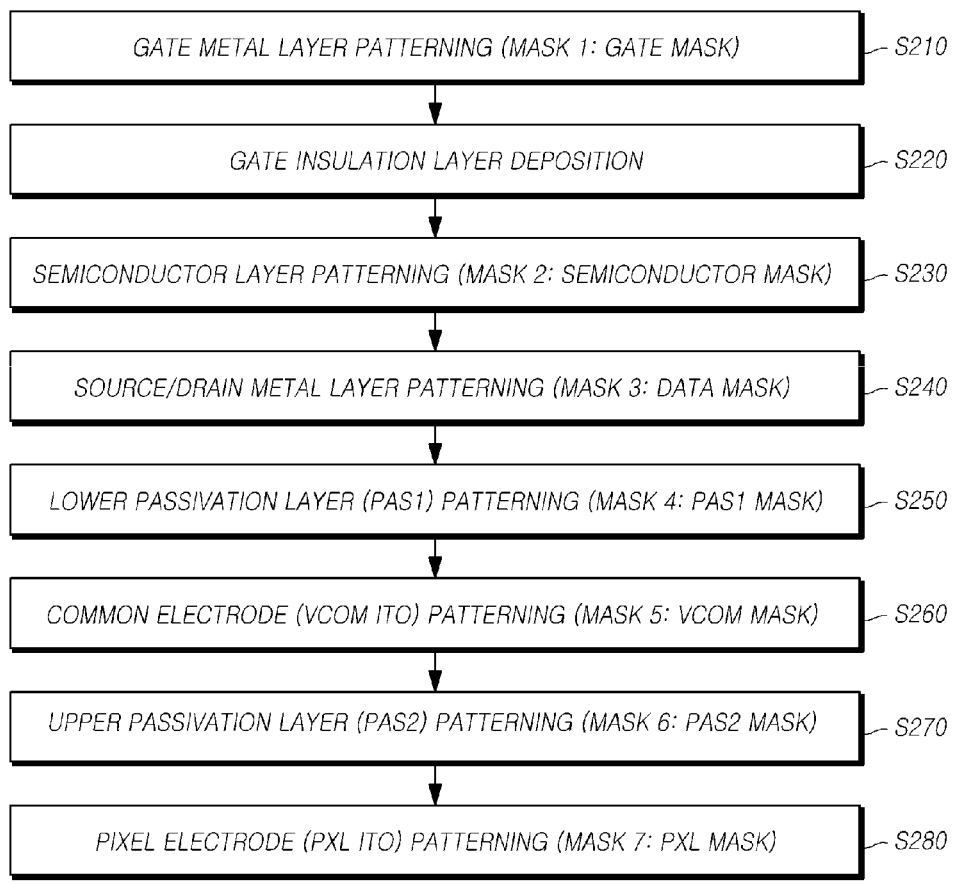
FIGS. 2A and 2B are a flowchart of a 7-mask substrate manufacturing process using seven masks and a sectional view of a part of an array substrate formed by the process.
Figure 2B:
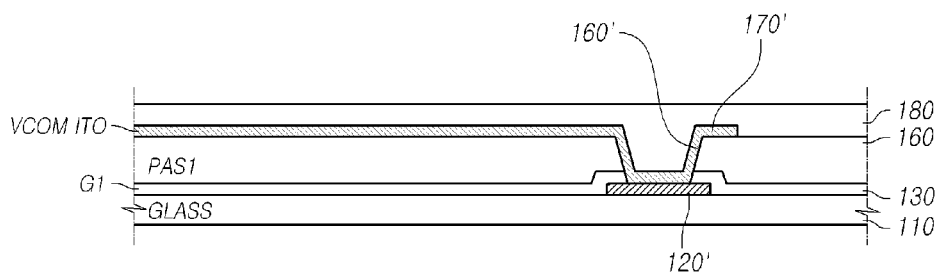

FIGS. 2A and 2B are a flowchart of a 7-mask substrate manufacturing process using seven masks and a sectional view of a part of an array substrate formed by the process.

The 7-mask process includes a step (S210) of patterning agate metal pattern on a substrate, and a gate mask, which is a first mask, is used in this step.

Now, the step (S210) of forming the gate metal pattern is described in more detail. A gate metal layer is deposited over an entire glass substrate and is then patterned to form a gate electrode by a photolithography and etching using a gate mask.

The photolithography is a process used in order to pattern a deposited layer into a predetermined pattern. In the photolithography, a photoresist having a photosensitivity is applied on a deposited layer and is then exposed to light, such as ultraviolet rays, through a mask having a predetermined pattern disposed thereof (photo process). Then, the photoresist is developed so that only a photoresist part corresponding to the mask pattern remains. In this state, the layer material at the part without the remaining photoresist is removed by dry etching or wet etching, so that only the leftover photoresist layer part remains.

Through the process described above, a pattern corresponding to the pattern of the mask may be formed on the layer. Types of the photolithography include a positive type in which a part (ultra-violet ray blocked part) not exposed to light due to the mask is formed as a pattern and a negative type in which a part (light transmitted part) exposed to light is formed as a pattern.

Hereinafter, a process of forming a particular pattern of a predetermined layer by photolithography as described above is called a deposition process, an exposure process, or an etching process or is collectively called a patterning process.

By the patterning (S210) of the gate metal pattern as described above, a gate line 13, a common voltage metal line 120' of a non-active area, a gate pad (not shown), etc. as well as the gate electrode 120 of FIGS. 1A and 1B may be simultaneously formed.

The gate metal pattern may be formed of one or more materials selected from metal materials having a low resistance property, such as copper Cu, copper alloy, aluminum Al, aluminum alloy AlNd, molybdenum Mo, and molybdenum alloy MoTi, without being limited thereto.

As the next step, a gate insulator 130 is formed on the gate metal pattern. The gate insulator 130 may be formed of a material, such as silicon nitride SiNx or silicon oxide $SiO_2$, may have a thickness of several thousands Å, and may be formed by depositing Middle Temperature Oxide (MTO) by Chemical Vapor Deposition (CVD) method (S220).

A semiconductor layer is patterned on the gate insulator (S230). The semiconductor layer is a layer for forming a channel between the source electrode 152 and the drain electrode 154, is also called an active layer, and may be configured by an amorphous silicon (a-Si) layer and an N+ doping layer or by a molybdenum Titanium (MoTi) layer and an N+ doping layer. Meanwhile, a semiconductor mask, which is a second mask, may be used for semiconductor patterning.

A source/drain metal layer is deposited on the semiconductor layer pattern 140 and a source/drain metal pattern having a predetermined pattern is formed by a photolithography and wet etching using a source mask or data mask, which is a third mask (S240).

The source/drain metal layer 150 may include the source electrode 152 and the drain electrode 154 as shown in FIGS. 1A and 1B in the active area and may include the common voltage metal line 16' as shown in FIG. 1A in the non-active area. Further, although not shown, the source/drain metal layer 150 may include data lines in the active area and data pads in the non-active area.

Like the gate metal layer, the source/drain metal layer may be formed of one or more materials selected from metal materials having a low resistance property, such as copper Cu, copper alloy, aluminum Al, aluminum alloy AlNd, molybdenum Mo, and molybdenum alloy MoTi, without being limited thereto.

Next, the first inorganic passivation layer PAS1 as the lower passivation layer is patterned using the first passivation layer mask (PAS1 mask), which is a fourth mask. That is, after depositing a material of the first inorganic passivation layer PAS1, the pattern of the first inorganic passivation layer PAS1 160 having a predetermined pattern is formed through photolithography and etching using the PAS1 mask, which the fourth mask.

As described above, the lower passivation layer may include an organic passivation layer in addition to the first inorganic passivation layer. In this event, after the first inorganic passivation layer PAS1 and the organic passivation layer PAC are deposited, the patterning process using the PAS1 mask may be performed.

The first inorganic passivation layer PAS1 may be formed of an inorganic insulation material, such as silicon nitride SiNx, with a thickness of several thousands of Å, and may be formed of a soluble material including silicon, oxygen, and carbon, or of a material, such as silicon compound, siloxane, or polyorgano siloxane in some cases.

The organic passivation layer may be formed of an organic insulation material, such as benzocyclobutene (BCB) or photo-acryl (PAC) having a photosensitive hardening property, and may have a thickness of about 1 to 2 μm, without being limited thereto.

It is usual that the organic passivation layer PAC is thicker than the first inorganic passivation layer PAS1, and that the material of the first inorganic passivation layer has a large electric resistance and thus has a large capacitance, such as a large parasitic capacitance formed by the upper and lower metal patterns, while the photo-acryl, which is the material of the organic passivation layer, does not allow generation of a large parasitic capacitance.

The reason for use of the organic passivation layer (PAC) is that an organic insulation material, such as photo-acryl, has a relatively small electric resistance and a relatively large dielectric ratio, which minimizes occurrence of parasitic capacitance and thus provides an advantage in view of the process, even when the organic insulation material is thick, a difference from the inorganic insulation layer (PAS). The advantage in view of the process lies in that, although the inorganic passivation layer (PAS) allows proceeding to a next step only after all photoresist deposited for the patterning is removed through exposure, development, etching, etc., the organic insulation material has photosensitive and hardening characteristics, which enables remaining organic insulation material immediately after exposure, development, and etching of the organic insulation material without deposition of separate photoresist to be directly used as an organic passivation layer.

However, the organic passivation layer (PAC) has a weak adhesive force to the metal layer (source/drain metal layer) and the semiconductor layer disposed thereunder and may cause channel contamination and thin film transistor characteristic degradation due to contact between the organic insulation material and the material of the semiconductor layer. In this regard, it is recommendable to use the first inorganic passivation layer (PAS1).

That is, the lower passivation layer according to an embodiment of the present invention either includes only the first inorganic passivation layer PAS1 or has a multi-structure including the first inorganic passivation layer PAS1 and the organic passivation layer (PAC).

Next, a common electrode layer, which is a lower transparent electrode layer, is deposited on the lower passivation layer pattern and is patterned using a common electrode mask, which is a fifth mask (S260). In this step, the material of the common electrode has a relatively large work function value and may be a transparent conductive material, such as Indium-Tin-Oxide (ITO) or Indium-Zinc-Oxide (IZO) without being limited thereto. As used herein, the transparent electrode material or transparent electrode layer may be referred to as ITO and the common voltage electrode or common electrode of the transparent conductive material may be referred to as Vcom ITO.

In the 7-mask process as shown in FIGS. 2A and 2B, the lower passivation layer is separately patterned using a passivation layer (PAS1) mask. Therefore, it is possible to directly interconnect the common electrode (Vcom ITO) and the common voltage metal line 120' of the non-active area as shown in FIG. 2B.

That is, in the process of patterning the lower passivation layer (PAS1), by opening the passivation layer (PAS1) on the common voltage metal line 120' to form a contact hole 160' and then patterning a common electrode (Vcom ITO) 170', the common voltage metal line 120' and the common electrode (Vcom ITO) can be directly interconnected as shown in FIG. 2B.

Figure 3A:
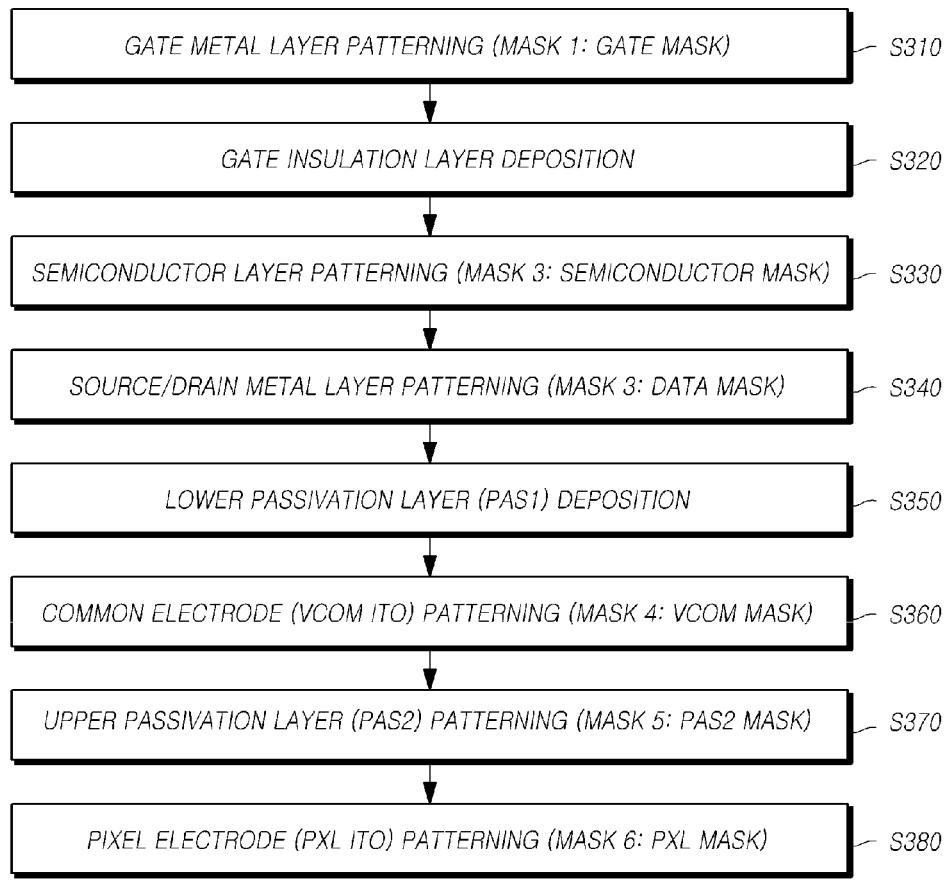
FIGS. 3A and 3B are a flowchart of a 6-mask substrate manufacturing process using six masks and a sectional view of a part of an array substrate formed by the process.
Figure 3B:
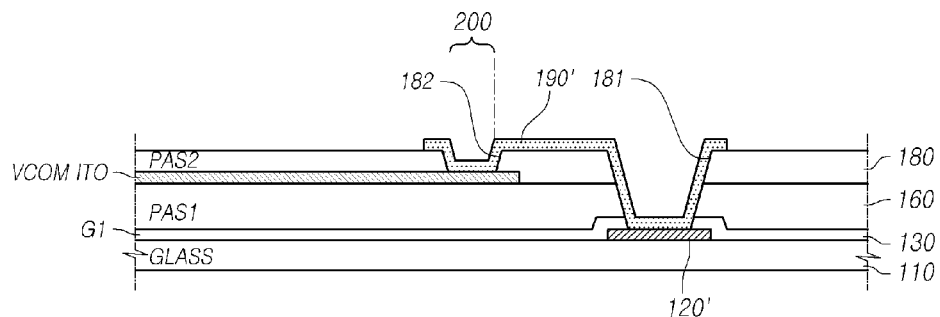

As will be described below again, the above mentioned point is a difference from the 6-mask process shown in FIGS. 3A and 3B. The 6-mask process without the lower passivation layer (PAS1) mask as shown in FIGS. 3A and 3B requires a jumping structure for interconnecting a common electrode layer (Vcom ITO) and a common voltage metal line. However, in the 7-mask process using the lower passivation layer (PAS1) mask, the common transparent electrode (Vcom ITO) and the common voltage metal line 120' can be directly interconnected even without a separate jumping structure, as shown in FIG. 2B.

Next, the second inorganic passivation layer PAS2 as an upper passivation layer is deposited and is then patterned using a PAS2 mask corresponding to a sixth mask (S270).

Finally, a pixel electrode layer as the highest layer is deposited and is then patterned using a pixel electrode mask (PXL mask) corresponding to a seventh mask (S280).

Similarly to the common electrode, the pixel electrode may be formed of a transparent conductive material, such as Indium-Tin-Oxide (ITO) or Indium-Zinc-Oxide (IZO), without being limited thereto. As used herein, the transparent electrode material or transparent electrode layer maybe referred to as ITO and the pixel electrode of the transparent conductive material may be referred to as PXL ITO.

FIGS. 3A and 3B are a flowchart of a 6-mask substrate manufacturing process using six masks and a sectional view of a part of an array substrate formed by the process.

Differently from the 7-mask process shown in FIGS. 2A and 2B, the 6-mask process does not use a lower passivation layer mask.

Excluding the same part as that of FIGS. 2A and 2B, the 6-mask substrate manufacturing process as shown in FIGS. 3A and 3B will be described hereinafter.

First, a gate metal layer patterning step (S310) using a gate mask corresponding to the first mask, a gate insulation layer forming step (S320), a semiconductor layer patterning step (S330) using a semiconductor mask corresponding to the second mask, and a source/drain metal layer patterning step (S340) using a data mask (source mask) corresponding to the third mask are the same as those of the 7-mask process shown in FIGS. 2A and 2B.

Next, a lower passivation layer (PAS1) is deposited and this lower passivation layer is not patterned (S350). That is, a PAS1 mask as shown in FIGS. 2A and 2B is not used. Instead, the lower passivation layer is deposited over the entire substrate, and a common electrode (Vcom ITO) layer is directly deposited thereon and is then patterned using a common electrode mask (Vcom mask) corresponding to the fourth mask (S360).

Next, the second inorganic passivation layer (PAS2) corresponding to the upper passivation layer is deposited and is then patterned using a PAS2 mask corresponding to the fifth mask (S370), and a pixel electrode layer is deposited thereon and is then patterned using a pixel electrode mask corresponding to the sixth mask to form a pixel electrode pattern (PXL ITO) (S380).

Meanwhile, although the lower passivation layer (PAS1) is not patterned, it may be etched or removed together when the common electrode layer and upper passivation layer (PAS2) formed thereon are patterned.

As described above, in the 6-mask process without a mask or patterning step for only the lower passivation layer (PAS1), it is impossible to achieve a direction interconnection between the common electrode (Vcom ITO) of the active area and the common voltage metal line of the non-active area as shown in FIGS. 2A and 2B. It is because it is impossible to form a passivation hole for only the lower passivation layer (PAS1) and the lower passivation layer can be etched or removed only together with the common electrode (Vcom ITO) and the upper passivation layer (PAS2) when they are patterned.

Therefore, the substrate manufacturing process without a patterning step or a mask for only the lower passivation layer (PAS1) uses a jumping pixel electrode pattern 190' as a jumping structure as shown in FIG. 3B.

In other words, as shown in FIG. 3B, the transparent jumping pixel electrode pattern electrically interconnects the common voltage metal line 120' exposed through a first contact hole 181 formed by partially opening the lower passivation layer (PAS1) and the upper passivation layer (PAS2) and the transparent common voltage electrode pattern (Vcom ITO) exposed through a second contact hole 182 formed by partially opening the upper passivation layer (PAS2) in the jumping passivation layer passivation hole area 200.

In a more detailed view of the process, when the upper passivation layer (PAS2) is deposited and patterned, the second contact hole 182 is formed on the common electrode or transparent common voltage electrode. Then, a first contact hole 181 is formed on the common voltage metal line 120' by partially removing both the upper passivation layer and the lower passivation layer. Thereafter, a pixel electrode layer is formed thereon and is then patterned to form a jumping pixel electrode pattern 190' electrically interconnecting the transparent common electrode layer (Vcom ITO) and the common voltage metal line layer.

Figure 4A:
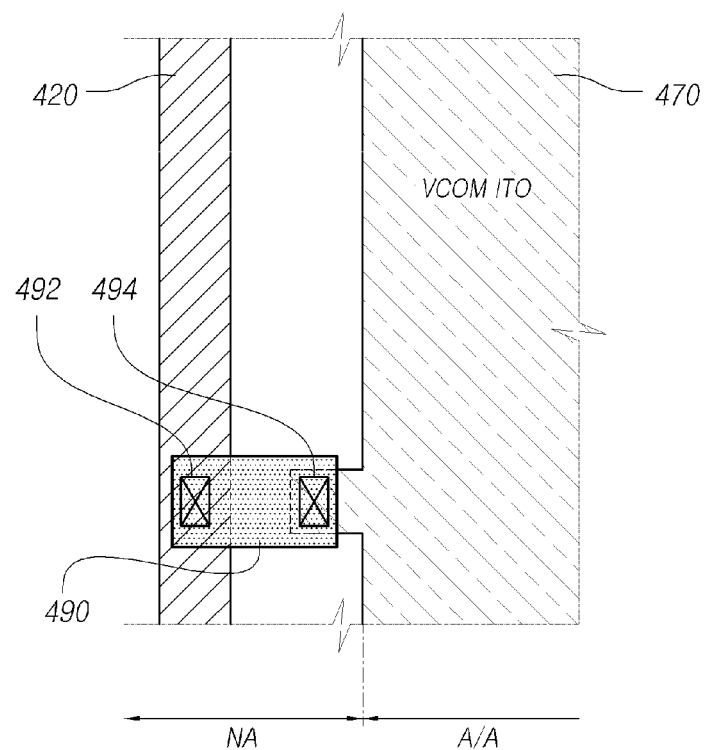
FIGS. 4A and 4B are enlarged sectional views of the left encircled portion in FIG. 1A, which illustrates a jumping structure of the transparent common electrode (Vcom ITO) and the common voltage metal line formed by a gate metal layer.
Figure 4B:
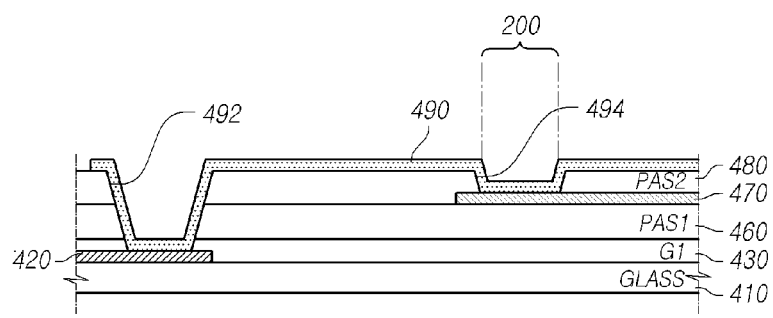

FIGS. 4A and 4B are enlarged sectional views of the left encircled portion in FIG. 1A, which illustrate a jumping structure of the common electrode (Vcom ITO) and the common voltage metal line formed by a gate metal layer.

As shown in FIGS. 4A and 4B, a common electrode (Vcom ITO) 470 as a transparent electrode covering the pixel portion is formed in the active area, a common voltage metal line 420 in the gate metal layer is formed in the non-active area, and a jumping pixel electrode pattern 490 for electrically interconnecting them is formed between them.

In more detail, a first contact hole 492 is formed on the common voltage metal line 420 of the non-active area by partially opening the gate insulation layer 430, the lower passivation layer (PAS1) 460, and the upper passivation layer (PAS2) 480, a second contact hole 494 is formed at the jumping passivation hole area 200 for connection of the transparent common electrode (Vcom ITO) by partially opening the upper passivation layer (PAS2) 480, and the jumping pixel electrode pattern 490 is formed thereon.

Figure 5A:
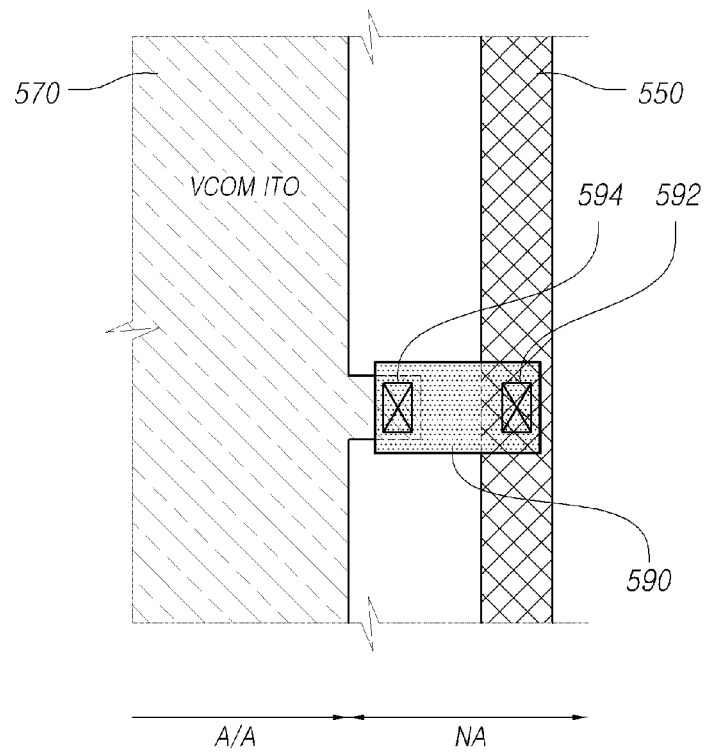
FIGS. 5A and 5B are enlarged sectional views of the right encircled portion in FIG. 1A, which illustrate a jumping structure of the transparent common electrode layer (Vcom ITO) and the common voltage metal line formed by a data metal layer or source/drain metal layer.
Figure 5B:
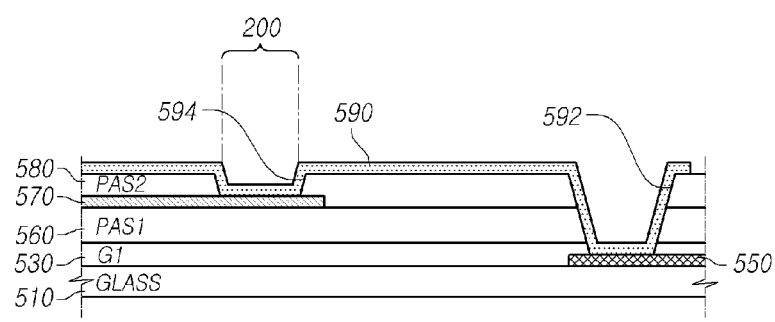

FIGS. 5A and 5B are enlarged sectional views of the right encircled portion in FIG. 1A, which illustrate a jumping structure of the transparent common electrode layer (Vcom ITO) and the common voltage metal line formed by a data metal layer or source/drain metal layer.

As shown in FIGS. 5A and 5B, a common electrode (Vcom ITO) 570 as a transparent electrode covering the pixel portion is formed in the active area and a common voltage metal line 550 in the source/drain metal layer is formed in the non-active area, and a pixel electrode pattern 590 for electrically interconnecting them is formed between them.

In more detail, a first contact hole 592 is formed on the common voltage metal line 520 of the non-active area by partially opening both the lower passivation layer (PAS1) 560 and the upper passivation layer (PAS2) 580, a second contact hole 594 is formed at the jumping passivation hole area 200 for connection of the transparent common electrode (Vcom ITO) by partially opening the upper passivation layer (PAS2) 580, and the jumping pixel electrode pattern 590 is formed thereon.

As described above, in the jumping passivation hole area 200 defined by the present disclosure, the common electrode (Vcom ITO) pattern and the jumping pixel electrode (PXL ITO) are vertically in direct contact with each other and both the common electrode (Vcom ITO) pattern and the jumping pixel electrode (PXL ITO) are formed of a transparent conductive material, such as ITO or IZO.

Figure 6A:
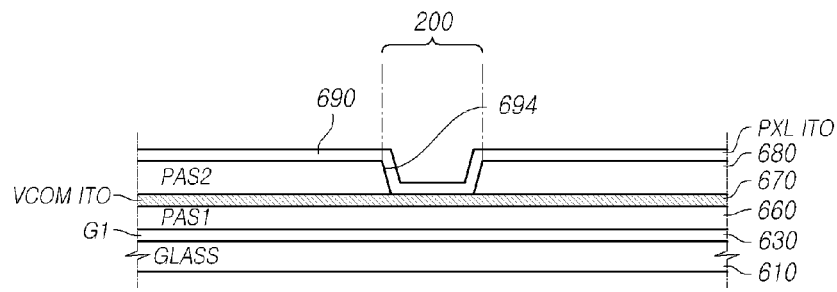
FIGS. 6A to 6C are sectional views of an array substrate in a pixel electrode rework process to which an embodiment of the present invention can be applied.
Figure 6B:
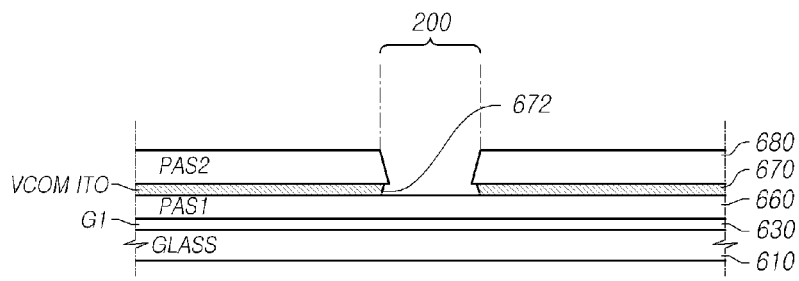
Figure 6C:
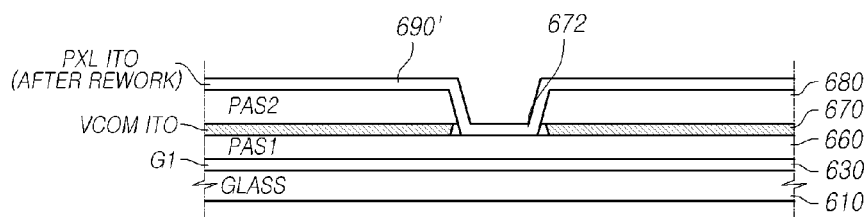

FIGS. 6A to 6C are sectional views of an array substrate in a pixel electrode rework process to which an embodiment of the present invention can be applied.

After an array substrate is manufactured through a process as shown in FIGS. 2A and 2B or FIGS. 3A and 3B, a defect may occur in a part of the pixel electrode pattern or pixel electrode layer corresponding to the highest layer.

Then, since the pixel electrode layer is the highest layer, it is possible to perform a process of entirely removing the defective pixel electrode layer and forming a new pixel electrode layer. This process can be referred to as a pixel electrode layer rework process, an ITO rework process, or simply and broadly referred to as a rework process. In the present disclosure, it is simply referred to as a rework process.

Of course, the present invention is not limited to the term "rework" and the rework process should be interpreted as including all procedures of entirely removing and newly patterning a pixel electrode layer or transparent electrode layer that forms the highest layer.

In the rework process, the defective pixel electrode layer is entirely etched and removed. For example, the defective pixel electrode layer is entirely removed by wet-etching the entire substrate surface.

As described above with reference to FIGS. 4A and 4B and FIGS. 5A and 5B, in the jumping passivation hole area 200, the common electrode (Vcom ITO) pattern and the jumping pixel electrode (PXL ITO) are vertically in direct contact with each other and both the common electrode (Vcom ITO) pattern and the jumping pixel electrode (PXL ITO) are formed of a transparent conductive material, such as ITO or IZO.

Therefore, in the rework process, when the entire substrate surface is subject to wet etching, etc. in order to remove the pixel electrode layer corresponding to the highest layer, not only the highest pixel electrode layer (PXL ITO) but the common electrode layer (Vcom ITO) beneath and in direct contact with the pixel electrode layer can also be removed together in the jumping passivation hole area 200.

Hereinafter, this phenomenon is described with reference to FIGS. 6A to 6C. Referring to FIG. 6A, in the jumping passivation hole area 200 according to an embodiment of the present invention, a transparent common electrode (Vcom ITO) 670 is formed on the first inorganic passivation layer (PAS1) 660 corresponding to a lower passivation layer, and a jumping pixel electrode pattern (PXL ITO) 690 as a jumping structure with a common voltage metal line at a non-active area (not shown) is formed on the transparent common electrode (Vcom ITO) 670.

In this state, if an entire substrate surface etching for the rework process is performed, the highest pixel electrode layer is entirely removed in the jumping passivation hole area 200 and a part of the transparent common electrode (Vcom ITO) pattern beneath the pixel electrode layer is simultaneously removed, as shown in FIG. 6B. This is because, a process, such as wet etching, of removing the pixel electrode layer may etch not only the pixel electrode layer but also the common electrode layer thereunder formed of a same/similar material.

In this event, as shown in FIG. 6B, a common electrode loss portion 672 maybe formed in the common electrode layer of the jumping passivation hole area 200. The common electrode loss portion 672 may have a recess shape deeper than the second contact hole 694 forming the passivation hole area 200 due to overetching, etc.

In this state, if a rework pixel electrode pattern 690' is formed in order to form a new pixel electrode layer, the rework pixel electrode pattern 690' may not be connected to the common electrode layer 670 in the jumping passivation hole area 200 as shown in FIG. 6C. That is, the common electrode loss portion 672 formed in the entire surface etching process of the rework process may prevent the rework pixel electrode pattern 690' and the common electrode layer 670 remaining in the jumping passivation hole area 200 from being connected to each other.

As a result, after the highest pixel electrode rework process is performed, interconnection between the common electrode (Vcom ITO) and the common voltage metal line is not achieved and a common voltage as a reference voltage is thus not applied. Then, driving failure of the display device, such as flickering or trembling of a screen at the time of driving and data pad open failure, may occur to thereby reduce the entire array substrate throughput.

Therefore, an embodiment of the present invention proposes a rework method of forming a rework pixel electrode layer in a state in which transparent electrode layers (a common electrode layer and a pixel electrode pattern) remain in a jumping passivation hole area, by using a rework mask protecting a jumping passivation hole area in a highest pixel electrode rework process.

Use of the rework method according to an embodiment of the present invention as described above can maintain the electric connection between the common electrode layer and the rework pixel electrode pattern in the jumping passivation hole area even after the pixel electrode rework process, which thereby reduces the occurrence of failure and the reduction of throughput due to the rework process.

Figure 7A:
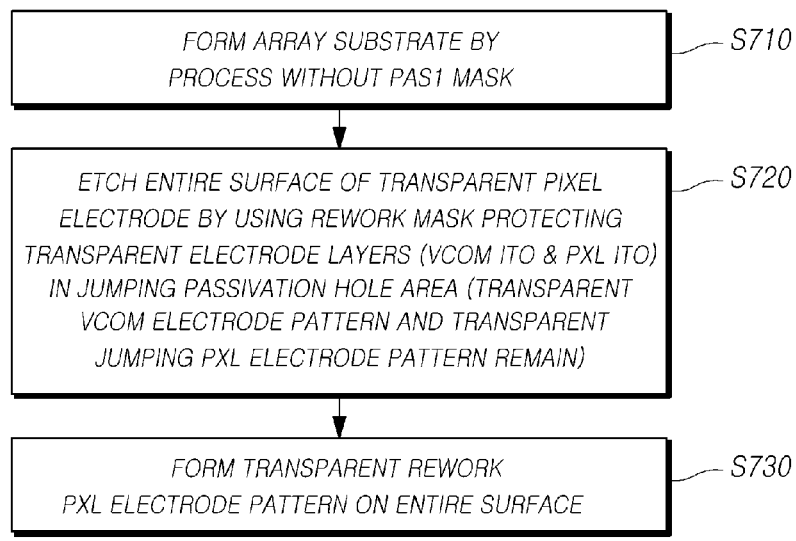
FIGS. 7A and 7B are flowcharts illustrating a rework method according to an embodiment of the present invention.

FIGS. 7A are 7B are flowcharts illustrating a rework method according to an embodiment of the present invention.

The subject to which an embodiment of the present invention can be applied may be an array substrate or a substrate for a display device, which has a Field Switching (FFS) structure of a so-called Pixel-On-Top (POT) mode, including a gate metal layer, a gate insulation layer (GI), a semiconductor layer, a source/drain metal layer, a lower passivation layer, a transparent common voltage electrode layer, an upper passivation layer, and a transparent pixel electrode layer sequentially formed in a thin film transistor area of an active area, without being limited thereto.

Further, a common voltage metal line is formed in the non-active area of the array substrate, a jumping passivation hole is formed in order to electrically interconnect a transparent common voltage metal layer and the common voltage metal line of the non-active area, and a transparent common voltage metal pattern and a transparent jumping pixel electrode pattern are formed on the lower passivation layer in the jumping passivation hole area.

Figure 7B:
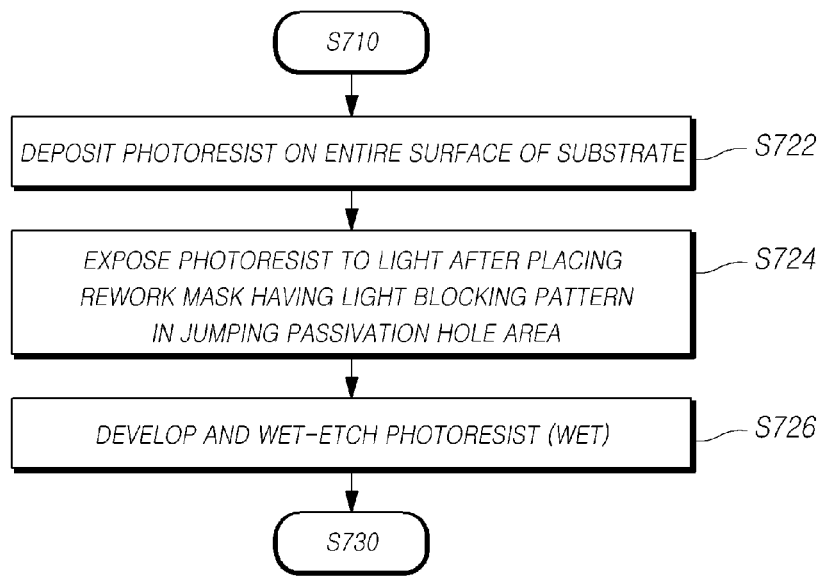

The rework method of an array substrate according to the embodiment of the present invention shown in FIGS. 7A and 7B may include a first step (S720) of entirely removing a transparent pixel electrode layer other than the transparent jumping pixel electrode pattern and the transparent common electrode layer in the jumping passivation hole area by using a rework mask for preventing the transparent electrode patterns in the jumping passivation hole area from being etched at the time etching an entire surface of the transparent pixel electrode layer, and a second step (S730) of forming a transparent rework pixel electrode layer on the entire surface.

In the present disclosure, the common voltage electrode and the common electrode are used to have the same meaning.

FIG. 7B is a flowchart illustrating sub-steps of the first step (S720), which include: an application step (S722) of applying photoresist on an entire surface of a substrate to be reworked; an exposure step (S724) of placing a rework mask having a rework pattern corresponding to the jumping passivation hole area on the substrate and exposing the photoresist on the substrate to light through the rework mask; and an etching step (S726) of developing and then etching the exposed photoresist to remove the transparent pixel electrode layer other than the transparent jumping pixel electrode pattern and the transparent common voltage electrode pattern in the jumping passivation hole area.

In this event, the rework pattern of the rework mask may be either a blocking pattern for preventing the jumping passivation hole area from being exposed to light or a transmissive pattern for allowing the jumping passivation hole area to be exposed to light. That is, the rework pattern may be a blocking pattern blocking the light to the jumping passivation hole area in the case of a positive photoresist in which exposed photoresist is removed by development, and may be a transmissive pattern allowing transmission of light to the jumping passivation hole area in the case of a negative photoresist in which unexposed photoresist is removed by development.

Meanwhile, an array substrate to which an embodiment of the present invention is applied is manufactured by a process that does not use a mask for patterning the lower passivation layer, and such a process not using the lower passivation layer mask (PAS1 mask) may be a 6-mask process.

Usually, a 6-mask process refers to a process using six masks including a gate mask, a semiconductor layer mask, a source mask, a common electrode mask, an upper passivation layer (PAS2) mask, and a pixel electrode mask is used.

However, the present invention is not limited to the 6-mask process and may employ a 5-mask process when one half-tone mask or diffraction mask for the patterning of the semiconductor layer or source/drain electrode layer.

Therefore, the process of manufacturing an array substrate to which an embodiment of the present invention is applied should be interpreted to include all processes that do not use a mask for only the lower passivation layer.

Figure 8A:
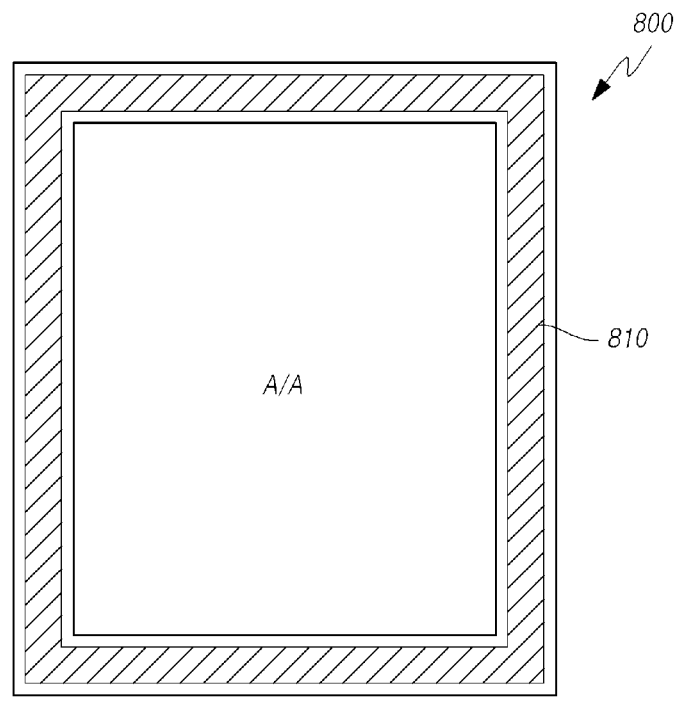
FIGS. 8A and 8B illustrate examples of rework masks used in an embodiment of the present invention.
Figure 8B:
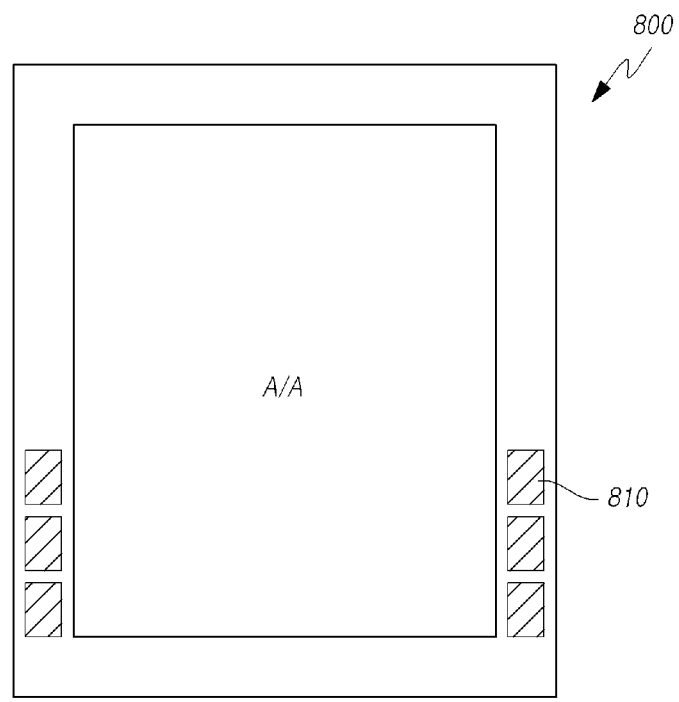

FIGS. 8A and 8B illustrate examples of rework masks used in an embodiment of the present invention.

In the embodiment of the present invention, a rework mask 800 covers an entire surface of a substrate and has a rework pattern corresponding to a jumping passivation hole formed therein.

That is, a portion of the rework mask corresponding to the active area of the substrate is open to allow complete penetration of ultra-violet rays for rework, while another area of the rework mask corresponding to the jumping passivation hole may have a rework pattern 810 formed therein to block the light.

The rework pattern 810 may be a large pattern having an elongated shape to simultaneously cover the jumping passivation holes as shown in FIG. 8A or an island-shaped pattern including shapes of islands, each of which can block light to an individual jumping passivation hole, as shown in FIG. 8B.

Of course, although the rework patterns shown in FIGS. 8A and 8B are light blocking patterns to block light to the jumping passivation hole, they may be a light transmissive patterns allowing penetration of light to the jumping passivation hole.

Further, although the portion of the rework mask 800 corresponding to the active area is completely open in the above description, it may have a pattern corresponding to a previously-formed highest pixel electrode layer or a pattern allowing penetration of light to a part of the active area in order to remove only a defective part.

Figure 9A:
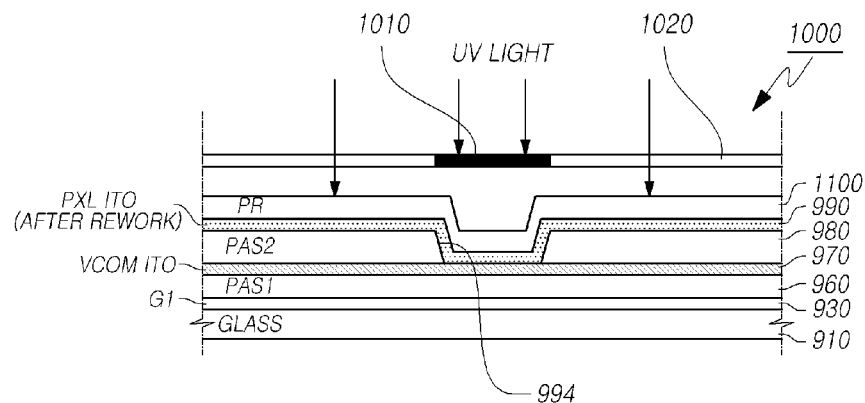
FIGS. 9A to 9C are sectional views of a substrate illustrating a rework process according to an embodiment of the present invention.
Figure 9B:
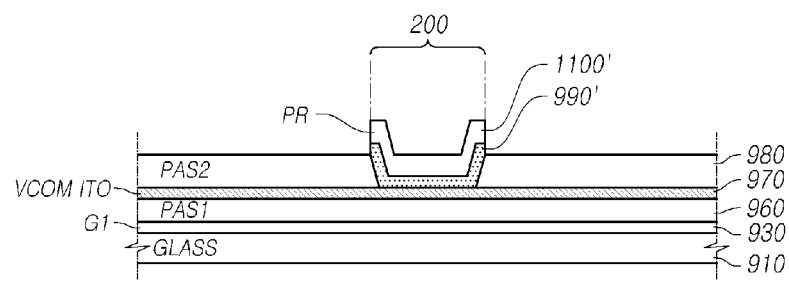
Figure 9C:
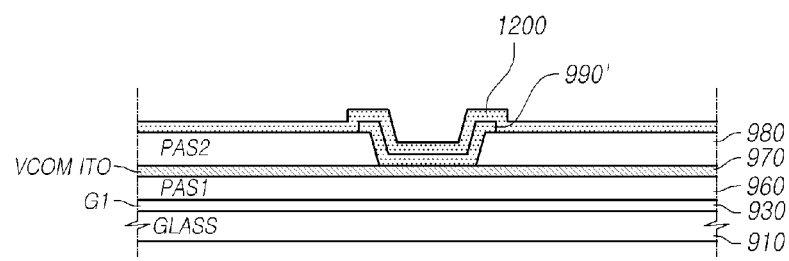

FIGS. 9A to 9C are sectional views of a substrate illustrating a rework process according to an embodiment of the present invention.

First, an array substrate to which a rework process according to an embodiment of the present invention is applied includes a gate insulation layer 930 on a glass substrate 910, a first inorganic passivation layer (PAS1) 960, which is a lower passivation layer, a common electrode layer (Vcom ITO) 970, a second passivation layer (PAS2) 980, which is an upper passivation layer, and a jumping pixel electrode pattern (PXL ITO) 990.

Especially, a second contact hole 994 is formed in a jumping passivation hole area 200 by partially opening the upper passivation layer, to allow a common electrode layer (Vcom ITO) 970 and a jumping pixel electrode pattern (PXL ITO) 990 to be in contact with each other in the passivation hole area.

The process of manufacturing an array substrate as described above does not use a lower passivation layer mask for patterning the lower passivation layer, which will be described in more detail hereinafter.

A gate metal layer is deposited on the glass substrate 910 and is then patterned to form a gate metal pattern by using a gate mask, which is the first mask. In this event, a common voltage metal line (920 in FIG. 10A) may be formed in the non-active area and a gate metal pattern may not be formed in the jumping passivation hole area 200.

Next, a gate insulation layer 930 may be deposited on an entire surface of the glass substrate including the common voltage metal line, wherein the gate insulation layer 930 may be formed of silicon nitride SiNx or silicon oxide SiO$_2$ with a thickness of thousands of Å.

Thereafter, a semiconductor layer is deposited and is then patterned to form a semiconductor layer pattern by using a semiconductor layer mask, which is a second mask. The semiconductor layer is a layer for forming a channel between a source electrode and a drain electrode and may be configured by an amorphous silicon (a-Si) layer and an N+ doping layer or by a molybdenum Titanium (MoTi) layer and an N+ doping layer.

Next, a source/drain metal layer is deposited and is then patterned to form a source/drain metal pattern by using a source mask or data mask, which is the third mask. In this process, a common voltage metal line 920 (see FIG. 10) may be formed in the non-active area.

The gate metal layer and the source/drain metal layer may be formed of one or more materials selected from metal materials having a low resistance property, such as copper Cu, copper alloy, aluminum Al, aluminum alloy AlNd, molybdenum Mo, and molybdenum alloy MoTi, without being limited thereto.

Meanwhile, in the patterning of the semiconductor layer patterning and source/drain metal pattern, a single half-tone mask or diffractive mask may be used instead of separate masks. That is, after both the semiconductor layer and the source/drain metal layer are deposited, they may be subjected to three stage exposure including transmission, transflection, and reflection by using a half-tone mask, and be then patterned in two stages.

Continuously, the first inorganic passivation layer (PAS1) 960 as the lower passivation layer is formed on an entire surface of the substrate. At this time, patterning of only the first inorganic passivation layer is not performed. Therefore, a mask for only the lower passivation layer is not used.

Meanwhile, the lower passivation layer may have a multi-layer structure including an organic passivation layer (PAC), such as a photo-acryl layer, as well as the first inorganic passivation layer 960.

The first inorganic passivation layer (PAS1) may be formed of an inorganic insulation material, such as silicon nitride SiNx, with a thickness of thousands of Å, and the organic passivation layer may be formed of an organic insulation material, such as benzocyclobutene (BCB) or photo-acryl (PAC) having a photosensitive hardening property and may have a thickness of about 1 to 2 μm, without being limited thereto.

Next, a common electrode layer is deposited by a transparent conductive material and is then patterned to form a common electrode layer 970 by using a common electrode mask as the fourth mask.

Next, the second inorganic passivation layer (PAS2) 980 as an upper passivation layer is deposited on the common electrode layer (Vcom ITO) 970, and is then patterned using a PAS2 mask corresponding to a fifth mask.

In the upper passivation layer patterning process as described above, parts of the upper passivation layer of the jumping passivation hole area are removed to form a second contact hole 994 through which the common electrode layer thereunder is exposed.

Figure 10A:
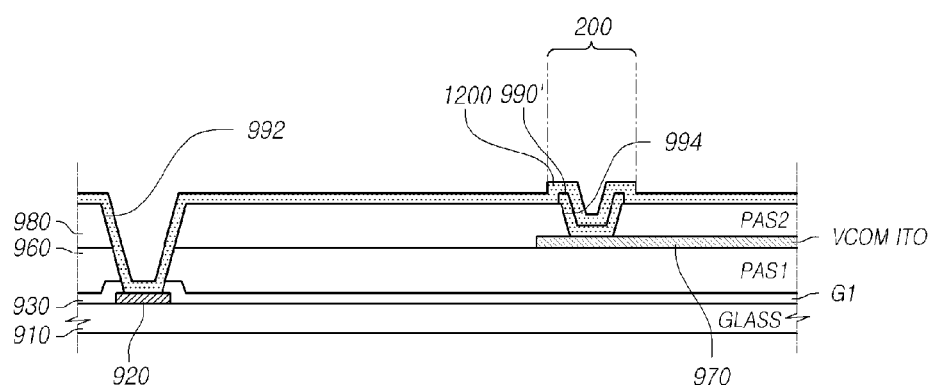
FIGS. 10A and 10B are sectional views of a reworked array substrate according to an embodiment of the present invention.

Further, as shown in FIG. 10A, by removing both the upper passivation layer and the lower passivation layer on the common voltage metal line 920 in the non-active area, a first contact hole 992 for exposing the common voltage metal line 920 is formed.

Next, a pixel electrode layer is deposited at the top thereof and is then patterned to form a pixel electrode pattern by using a pixel electrode mask, which is the sixth mask. In this process, jumping pixel electrode patterns 990' for electrically interconnecting the common voltage metal line 920 or 950 and the common electrode layer 970 through the first contact hole 992 and the second contact hole 994 are formed.

Here, the common electrode, pattern 970 and the jumping pixel electrode pattern 990 have a relatively large work function value and may be formed of a transparent conductive material, such as Indium-Tin-Oxide (ITO) or Indium-Zinc-Oxide (IZO), without being limited thereto.

When there is a defect in the top pixel electrode layer of the array substrate manufactured as described above, a rework process for forming the pixel electrode again is performed.

In the rework process according to an embodiment of the present invention, as shown in FIG. 9A, photoresist 1100 is applied on the entire surface of the substrate.

A rework mask 1000 including a rework pattern 1010 for shielding the jumping passivation hole area 200 is disposed on the substrate, which is then exposed to light.

Next, development is performed, so that only leftover photoresist 1100' on the jumping passivation hole area 200 remains. Then, wet etching is performed using the leftover photoresist 1100' as a passivation layer.

Then, only the jumping pixel electrode pattern in the jumping passivation hole area 200 remains while all the other parts of the jumping pixel electrode pattern are removed. As used here, the remaining pixel electrode pattern is referred to as the leftover pixel electrode pattern 990'. Further, in the process, differently from the process shown in FIGS. 6A to 6C, the common electrode layer 970 is not damaged at all.

That is, in the rework process without using a rework mask, a common electrode loss portion 672 in which a part of the common electrode layer 670 in the jumping passivation hole area 200 is lost together as shown in FIGS. 6A to 6C may be formed. However, use of a rework mask according to an embodiment of the present invention does not allow damage of the common electrode layer at all, as shown in FIGS. 9A to 9C.

Next, the leftover photoresist 1100' is removed, a pixel electrode layer for rework is deposited again, and the same patterning process as the initial pixel electrode layer patterning process is performed.

Then, as shown in FIG. 9C, the leftover pixel electrode pattern 990' and the rework pixel electrode pattern 1200 in contact with each other are formed on the common electrode layer in the jumping passivation hole area 200.

Figure 10B:
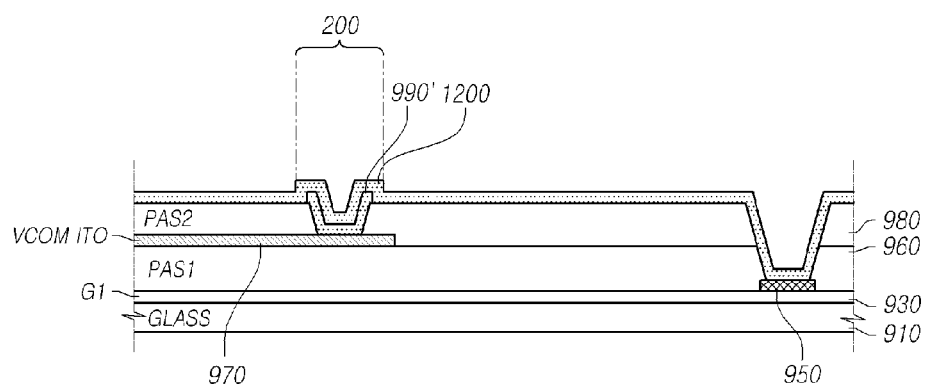

FIGS. 10A and 10B are sectional views of a reworked array substrate according to an embodiment of the present invention.

When an array substrate has been reworked according to the embodiment described above with reference to FIGS. 7A to 9C, the leftover pixel electrode pattern 990' and the rework pixel electrode pattern 1200 are formed in contact with each other on the common electrode layer 970 and the rework pixel electrode pattern 1200 is connected to the common voltage metal line 920 or 950 of the non-active area, in the jumping passivation hole area 200 as shown in FIGS. 10A and 10B. As a result, the electric connection between the common electrode layer 970 and the common voltage metal line 920 or 950 can be maintained.

In other words, after the rework process according to an embodiment of the present invention, the rework pixel electrode pattern 1200 at the highest layer electrically interconnects the common voltage metal line 920 or 950 exposed through the first contact hole 992 formed by partially opening the lower passivation layer and the upper passivation layer and the leftover pixel electrode pattern 990' and the common electrode layer 970 exposed through the second contact hole 994 formed by partially opening the upper passivation layer in the jumping passivation layer passivation hole area 200.

In this event, the common voltage metal line may be formed at the same layer as either the gate metal layer as shown in FIG. 10A or the source/drain metal layer as shown in FIG. 10B.

Embodiments of the present invention can be applied to not only an array substrate for a Liquid Crystal Display (LCD) device but also all types of substrates for a display device in which a jumping passivation hole (PAS hole) for interconnecting a common electrode layer and a common voltage metal line formed therein. For example, the embodiments can be applied to array substrates for an organic liquied crystal display device, a Plasma Display Panel (PDP), etc.

As described above, according to an embodiment of the present invention, it is possible to prevent the occurrence of a defect in a pixel electrode layer in a rework process thereof in an array substrate for a display device in which the pixel electrode is formed asa the highest layer.

Specifically, the present invention can prevent removal of a jumping pixel electrode pattern and a transparent common electrode layer by using a rework mask in a rework process, in a jumping passivation hole area for electrically interconnecting a transparent common electrode layer (Vcom ITO) and a common voltage metal line formed at a non-active area of a display panel, so as to maintain electric connection between the jumping pixel electrode pattern and the common electrode layer in the jumping passivation hole area after the rework process.

As a result, the present invention can prevent an operation failure a flickering failure, etc. due to a pixel electrode rework process, so as to improve the substrate manufacture throughput according to the rework process.

Actual tests have been made in order to determine failures of array substrates according to an embodiment of the present invention after being reworked. As noted from the following Table showing results of the tests, in a rework process without using a rework mask as shown in FIGS. 6A to 6C, 50 to 60 samples among about 1800 samples showed an occurrence of operation failure or pad failure. However, in a rework process using a rework mask according to the embodiment of the present invention shown in FIG. 7A and thereafter, only one sample among 1557 samples showed an occurrence of failure, which implies remarkable reduction of the failure rate according to the rework.

TABLE 1

|  | Without Rework Mask (FIGS. 6A to 6C) | With Rework Mask (FIGS. 7A to 10B) |
| --- | --- | --- |
| Number of examined panels | 1872 | 1557 |
| Driving failure | 64 | 0 |
| PAD failure | 54 | 1 |

Although exemplary embodiments of the present invention have been described for illustrative purposes, those skilled in the art will appreciate that various modifications, additions and substitutions are possible, without departing from the scope and spirit of the invention as disclosed in the accompanying claims. Therefore, exemplary embodiments of the present disclosure have been described for the sake of brevity and clarity. The scope of the present invention shall be construed on the basis of the accompanying claims in such a manner that all of the technical ideas included within the scope equivalent to the claims belong to the present invention.

What is claimed is:

1. A display device including an array substrate, the array substrate comprising:
   a lower passivation layer, a common electrode layer and an upper passivation layer, which are formed in an active area including a pixel;
   a common voltage metal line formed in a first area of a non-active area outside of the active area, the common voltage metal line supplying a common voltage to the pixel;
   a remnant pixel electrode pattern formed in a jumping passivation hole in a second area of the non-active area, the second area closer to the active area than the first area, the remnant pixel electrode pattern electrically coupled to the common electrode layer; and
   a rework pixel electrode pattern disposed on the remnant pixel electrode pattern and extending between the remnant pixel electrode pattern formed in the jumping passivation hole in the second area of the non-active area and the common voltage metal line formed in the first area of the non-active area, the rework pixel electrode pattern electrically coupling the remnant pixel electrode pattern and the common voltage metal line.

2. The display device of claim 1, wherein the common electrode layer, the remnant pixel electrode pattern, and the rework pixel electrode pattern are sequentially formed on the lower passivation layer in the second area of the non-active area.

3. The display device of claim 1, wherein the common voltage metal line in the first area of the non-active area is electrically coupled to the common electrode layer through the rework pixel electrode pattern and the remnant electrode pattern in that sequence.

4. The display device of claim 1, wherein the rework pixel electrode pattern contacts the common voltage metal line through the upper passivation layer and the lower passivation layer in the first area of the non-active area.

5. The display device of claim 1, wherein the rework pixel electrode pattern contacts the remnant pixel electrode pattern through the upper passivation layer in the second area of the non-active area.

6. The display device of claim 1, further comprising a back light unit for supplying light to the array substrate and a driving circuit unit including at least one of a timing controller, a data driver, a gate driver, a backlight driving unit and a power supply unit supplying electric power to driving circuits.

7. The display device of claim 6, wherein at least a part of the driving circuit unit is disposed on a liquid crystal panel including the array substrate according to a Chip On Glass (COG) or a Chip On Film (COF) mode.

8. The display device of claim 1, wherein the lower passivation layer comprises a multi-layer structure including an organic passivation layer and an inorganic passivation layer.

9. The display device of claim 8, wherein the organic passivation layer is thicker than the inorganic passivation layer.

10. A display device including an array substrate, the array substrate comprising:
    a lower passivation layer, a common electrode layer, an upper passivation layer, and a jumping pixel electrode pattern sequentially formed in a thin film transistor area of the display device, the jumping pixel electrode pattern including a remnant pixel electrode pattern and a rework pixel electrode pattern; and
    a jumping passivation hole for electrically interconnecting the common electrode layer and a common voltage metal line of the display device, the jumping passivation hole formed by partially opening the upper passivation layer,
    wherein the common electrode layer, the remnant pixel electrode pattern, and the rework pixel electrode pattern are sequentially formed on the lower passivation layer in an area of the jumping passivation hole, wherein the remnant pixel electrode pattern is electrically coupled to the common electrode layer, and
    wherein the rework pixel electrode pattern is disposed on the remnant pixel electrode pattern and formed to electrically interconnect (i) the common voltage metal line exposed through a first contact hole formed by partially opening the upper passivation layer and the lower passivation layer and (ii) the common electrode layer.

11. The display device of claim 10,
wherein the common voltage metal line is formed in a layer identical to a gate metal layer and the first contact hole is formed by opening the lower passivation layer, the upper passivation layer, and a gate insulation layer.

12. The display device of claim 10,
wherein the common voltage metal line is formed in a layer identical to a source/drain metal layer of a thin film transistor in an active area of the display device.

13. The display device of claim 10, further comprising:
a gate insulating layer formed above and connected to the common voltage metal line; and
a substrate formed beneath the gate insulating layer.

14. The display device of claim 10, further comprising a back light unit for supplying light to the array substrate and a driving circuit unit including at least one of a timing controller, a data driver, a gate driver, a backlight driving unit and a power supply unit supplying electric power to driving circuits.

15. The display device of claim 14, wherein at least a part of the driving circuit unit is disposed on a liquid crystal panel including the array substrate according to a Chip On Glass (COG) or a Chip On Film (COF) mode.

16. The display device of claim 10, wherein the lower passivation layer comprises a multi-layer structure including an organic passivation layer and an inorganic passivation layer.

17. The display device of claim 16, wherein the organic passivation layer is thicker than the inorganic passivation layer.

\* \* \* \* \*